US012598984B2

(12) United States Patent
Hwang et al.

(10) Patent No.: US 12,598,984 B2
(45) Date of Patent: Apr. 7, 2026

(54) SEMICONDUCTOR DEVICE INCLUDING CONDUCTIVE STRUCTURE AND METHOD FOR MANUFACTURING THE SAME

(71) Applicant: Samsung Electronics Co., Ltd., Suwon-si (KR)

(72) Inventors: Jungha Hwang, Yongin-si (KR); Dongchan Lim, Hwaseong-si (KR); Seulgi Bae, Yeosu-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 788 days.

(21) Appl. No.: 17/893,770

(22) Filed: Aug. 23, 2022

(65) Prior Publication Data

US 2023/0178487 A1 Jun. 8, 2023

(30) Foreign Application Priority Data

Dec. 2, 2021 (KR) ........................ 10-2021-0170850

(51) Int. Cl.
*H01L 23/532* (2006.01)
(52) U.S. Cl.
CPC .... *H01L 23/53204* (2013.01); *H01L 23/5329* (2013.01)
(58) Field of Classification Search
CPC ................................................ H01L 23/53238
See application file for complete search history.

(56) References Cited

U.S. PATENT DOCUMENTS

| | | | |
|---|---|---|---|
| 6,696,758 B2 | 2/2004 | Dubin et al. | |
| 9,111,938 B2 | 8/2015 | Baumann et al. | |
| 9,142,509 B2 | 9/2015 | Yu et al. | |
| 9,312,224 B1 | 4/2016 | Canaperi et al. | |
| 9,754,891 B2 | 9/2017 | Briggs et al. | |
| 10,157,784 B2 | 12/2018 | Yu et al. | |
| 10,163,699 B2 | 12/2018 | Nagai et al. | |
| 11,004,736 B2 | 5/2021 | Chen et al. | |
| 2002/0084529 A1* | 7/2002 | Dubin ............... | H01L 23/53238 257/E21.174 |
| 2010/0320604 A1* | 12/2010 | Isobayashi ........ | H01L 21/76805 257/E23.142 |

(Continued)

FOREIGN PATENT DOCUMENTS

| | | |
|---|---|---|
| KR | 10-2012-0025597 A | 3/2012 |
| KR | 10-2014-0020203 A | 2/2014 |
| KR | 10-2016-0066899 A | 6/2016 |

OTHER PUBLICATIONS

Taiwanese Office Action dated Oct. 12, 2023 issued in Taiwanese Patent Application No. 111145933.

(Continued)

*Primary Examiner* — Benjamin P Sandvik
(74) *Attorney, Agent, or Firm* — Fish & Richardson P.C.

(57) ABSTRACT

A semiconductor device including an insulating structure, and a conductive structure in the insulating structure may be provided. The conductive structure includes a barrier layer, an anti-migration layer on the barrier layer, a liner on the anti-migration layer, a conductive layer on the liner, and a capping layer covering a top surface of the barrier layer and a top surface of the anti-migration layer. The capping layer and the liner include Co. The anti-migration layer includes Mn.

18 Claims, 17 Drawing Sheets

(56)                   References Cited

U.S. PATENT DOCUMENTS

| | | | |
|---|---|---|---|
| 2012/0114869 A1* | 5/2012 | Miyoshi ............ | H01L 23/53238 |
| | | | 427/515 |
| 2014/0045329 A1 | 2/2014 | Ishizaka et al. | |
| 2016/0163586 A1* | 6/2016 | Siew ................... | H01L 23/5226 |
| | | | 438/653 |
| 2016/0293552 A1* | 10/2016 | Yim ................... | H01L 23/53238 |
| 2016/0307845 A1 | 10/2016 | Furuhashi | |
| 2019/0221477 A1 | 7/2019 | Amanapu et al. | |
| 2020/0098619 A1* | 3/2020 | Marieb ................... | C23C 18/48 |

OTHER PUBLICATIONS

Notice of Allowance in Korean Appln. No. 10-2021-0170850, mailed on Sep. 1, 2025, 5 pages (with English translation).

* cited by examiner

SEMICONDUCTOR DEVICE INCLUDING CONDUCTIVE STRUCTURE AND METHOD FOR MANUFACTURING THE SAME

CROSS-REFERENCE TO THE RELATED APPLICATION

This application claims priority to Korean Patent Application No. 10-2021-0170850, filed on Dec. 2, 2021, in the Korean Intellectual Property Office, the disclosure of which is incorporated herein by reference in its entirety.

BACKGROUND

1. Field

Some example embodiments of the disclosure relate to semiconductor devices. More particularly, some example embodiments of the disclosure relate to semiconductor devices including a conductive structure.

2. Description of the Related Art

Semiconductor devices are being highlighted in the electronics industry due to some characteristics thereof such as miniaturization, multi-functionalization, and low manufacturing costs. Semiconductor devices may be classified into a semiconductor memory device configured to store logic data, a semiconductor logic device configured to arithmetically process logic data, a hybrid semiconductor device including a memory element and a logic element, etc. In accordance with advances in the electronics industry, demand for characteristics of semiconductor devices is gradually increasing. For example, demand for high reliability, high speed, multi-functionalization, etc. of semiconductor devices is gradually increasing. In order to satisfy such demanded characteristics, structures in semiconductor devices become more and more complicated. In addition, semiconductor devices become more and more highly integrated.

SUMMARY

The example embodiments of the disclosure provide semiconductor devices including a conductive structure having enhanced electro-migration characteristics.

A semiconductor device according to some example embodiments of the disclosure may include an insulating structure, and a conductive structure in the insulating structure. The conductive structure may include a barrier layer, an anti-migration layer on the barrier layer, a liner on the anti-migration layer, a conductive layer on the liner, and a capping layer covering a top surface of the barrier layer and a top surface of the anti-migration layer. The capping layer and the liner may include Co. The anti-migration layer may include Mn.

A semiconductor device according to some example embodiments of the disclosure may include an insulating structure, and a conductive structure in the insulating structure. The conductive structure may include a conductive layer, a liner covering an outer sidewall of the conductive layer, an anti-migration layer covering an outer sidewall of the liner, a barrier layer covering an outer sidewall of the anti-migration layer, and a capping layer covering a top surface of the anti-migration layer and a top surface of the barrier layer. An upper portion of the anti-migration layer may include a bottom surface contacting a top surface of the liner.

A semiconductor device according to some example embodiments of the disclosure may include an insulating structure, and a conductive structure in the insulating structure. The conductive structure may include a barrier layer, an anti-migration layer on the barrier layer, a liner on the anti-migration layer, a conductive layer on the liner, and a capping layer covering a top surface of the barrier layer and a top surface of the anti-migration layer. A first sidewall of the capping layer may be connected to a first outer sidewall of the barrier layer. A second side wall of the capping layer may be connected to a second outer sidewall of the barrier layer.

A method for manufacturing a semiconductor device in accordance with some example embodiments of the disclosure may include etching an insulating layer, thereby forming a trench, forming a barrier layer on the insulating layer, forming a preliminary liner on the barrier layer, forming a first preliminary conductive layer on the preliminary liner, forming a second preliminary conductive layer on the first preliminary conductive layer, selectively forming a capping layer on the barrier layer, the preliminary liner and the first preliminary conductive layer, and performing a thermal treatment process.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
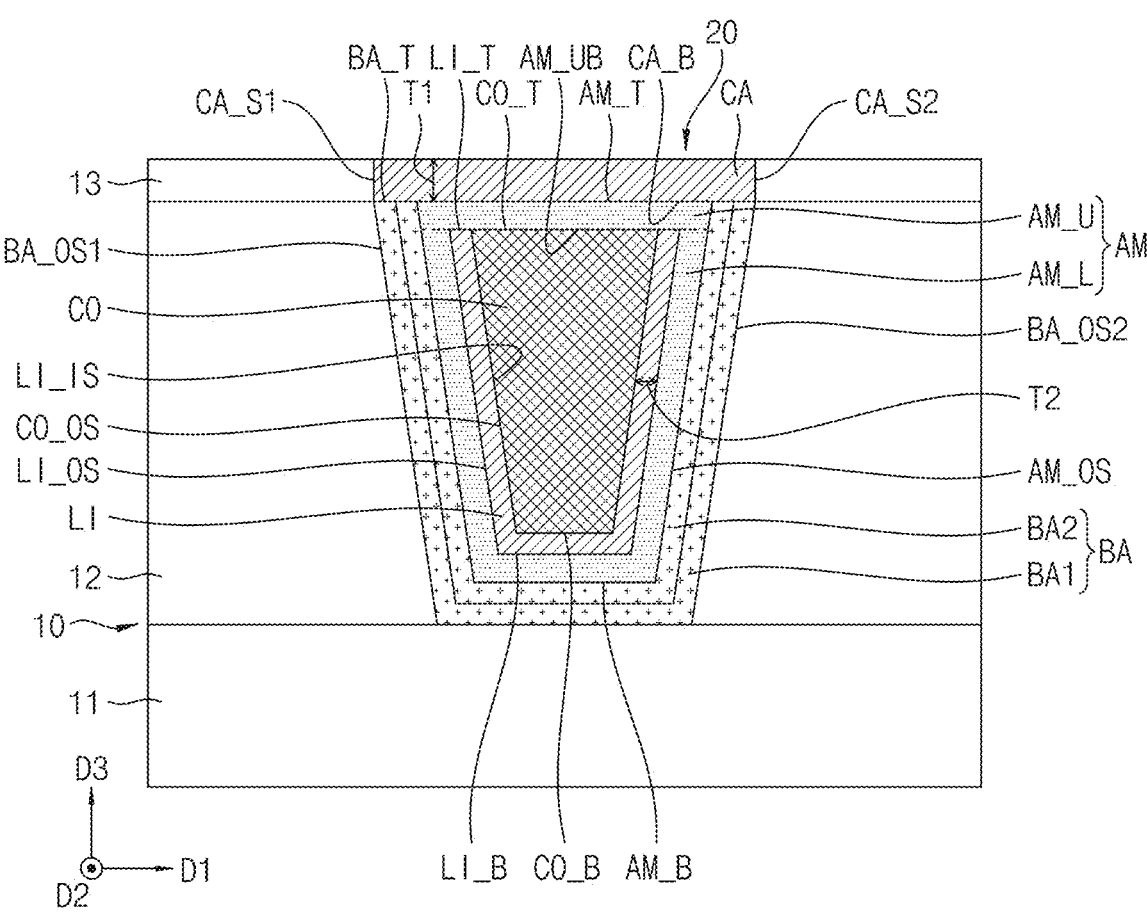
FIG. 1 is a sectional view of a semiconductor device according to some example embodiments of the disclosure.

FIG. 1 is a sectional view of a semiconductor device according to some example embodiments of the disclosure.

Referring to FIG. 1, the semiconductor device may include an insulating structure 10. The insulating structure 10 may have the form of a plate extending in a first direction D1 and a second direction D2. The first direction D1 and the second direction D2 may intersect each other. For example, the first direction D1 and the second direction D2 may be horizontal directions perpendicularly intersecting each other.

The insulating structure 10 may include a first insulating layer 11, a second insulating layer 12 on the first insulating layer 11, and a third insulating layer 13 on the second insulating layer 12. The first to third insulating layers 11, 12 and 13 may include oxide. In some example embodiments, each of the first to third insulating layers 11, 12 and 13 may be a multilayer insulating layer.

A conductive structure 20 may be provided in the insulating structure 10. The conductive structure 20 may extend through the second insulating layer 12 in a third direction D3. The third direction D3 may intersect the first direction D1 and the second direction D2. For example, the third direction D3 may be a vertical direction perpendicularly intersecting the first direction D1 and the second direction D2. In some example embodiments, the conductive structure 20 may be a conductive line extending in the second direction D2.

In some example embodiments, the insulating structure 10 may further include an insulating layer covering a top surface of the conductive structure 20. In some example embodiments, the third insulating layer 13 of the insulating structure 10 may cover a top surface of the conductive structure 20.

The conductive structure 20 may include a barrier layer BA, an anti-migration layer AM on the barrier layer BA, a liner LI on the anti-migration layer AM, a conductive layer CO on the liner LI, and a capping layer CA. In some example embodiments, each of the barrier layer BA, the anti-migration layer AM in the barrier layer BA, the liner LI in the anti-migration layer AM, the conductive layer CO in the liner LI, and the capping layer CA may extend in the second direction D2.

The conductive layer CO may be disposed at a central region of the conductive structure 20. The conductive layer CO may include a conductive material. For example, the conductive layer CO may include copper (Cu).

The liner LI may cover outer sidewalls CO_OS and a bottom surface CO_B of the conductive layer CO. The liner LI may contact the outer sidewalls CO_OS and the bottom surface CO_B of the conductive layer CO. The liner LI may include a conductive material different from that of the conductive layer CO. In some example embodiments, the liner LI may include pure cobalt (Co). In some example embodiments, the liner LI may include Co doped with an impurity, and the impurity may be at least one of N, B, P or W. In this case, the concentration of the impurity may be 20% or less. In some example embodiments, the liner LI may include a plurality of layers, and the plurality of layers may include different impurities, respectively.

The anti-migration layer AM may cover a top surface CO_T of the conductive layer CO and a top surface LI_T, outer sidewalls LI_OS and a bottom surface LI_B of the liner LI. The anti-migration layer AM may contact the top surface CO_T of the conductive layer CO and the top surface LI_T, the outer sidewalls LI_OS and the bottom surface LI_B of the liner LI. The anti-migration layer AM may include a conductive material different from those of the conductive layer CO and the liner LI. For example, the anti-migration layer AM may include manganese (Mn). The top surface LI_T of the liner LI and the top surface CO_T of the conductive layer CO may be coplanar. In a cross-sectional view according to FIG. 1, the anti-migration layer AM may surround or enclose the conductive layer CO and the liner LI.

The anti-migration layer AM may include an upper portion AM_U and a lower portion AM_L. The upper portion AM_U of the anti-migration layer AM may be a portion covering the top surface CO_T of the conductive layer CO and the top surface LI_T of the liner LI. The upper portion AM_U of the anti-migration layer AM may be a portion disposed at a higher level than the top surface CO_T of the conductive layer CO and the top surface LI_T of the liner LI. The lower portion AM_L of the anti-migration layer AM may be a portion covering the outer sidewalls LI_OS and the bottom surface LI_B of the liner LI. The lower portion AM_L of the anti-migration layer AM may be a portion disposed at a lower level than the top surface CO_T of the conductive layer CO and the top surface LI_T of the liner LI. Although the upper portion AM_U and the lower portion AM_L of the anti-migration layer AM have been described as being divided from each other, for convenience of description, the upper portion AM_U and the lower portion AM_L of the anti-migration layer AM may have an integrated structure in which the upper portion AM_U and the lower portion AM_L of the anti-migration layer AM are coupled to each other without having a boundary. A bottom surface AM_UB of the upper portion AM_U of the anti-migration layer AM may contact the top surface CO_T of the conductive layer CO and the top surface LI_T of the liner LI.

The barrier layer BA may cover outer sidewalls AM_OS and a bottom surface AM_B of the anti-migration layer AM. The barrier layer BA may contact the outer sidewalls AM_OS and the bottom surface AM_B of the anti-migration layer AM. A first outer sidewall BA_OS1 and a second outer sidewall BA_OS2 of the barrier layer BA may contact sidewalls of the second insulating layer 12. The first outer sidewall BA_OS1 and the second outer sidewall BA_OS2 of the barrier layer BA may oppose each other. A bottom surface of the barrier layer BA may contact a top surface of the first insulating layer 11.

The barrier layer BA may include a first barrier portion BA1, and a second barrier portion BA2 on the first barrier portion BA1. The second barrier portion BA2 may cover the outer sidewalls AM_OS and the bottom surface AM_B of the anti-migration layer AM. The first barrier portion BA1 may cover outer sidewalls and a bottom surface of the second barrier portion BA2. The first and second barrier portions BA1 and BA2 may include a conductive material different from those of the anti-migration layer AM, the liner LI and the conductive layer CO. The first and second barrier layers BA1 and BA2 may include different materials, respectively. For example, the first barrier layer BA1 may include TaN, and the second barrier portion BA2 may include Ta.

The capping layer CA may cover the top surface AM_T of the anti-migration layer AM and a top surface BA_T of the barrier layer BA. A bottom surface CA_B of the capping layer CA may contact top surface AM_T of the anti-migration layer AM and the top surface BA_T of the barrier layer BA.

The capping layer CA may include the same conductive material as the liner LI. In some example embodiments, the capping layer CA may include pure Co. In some example embodiments, the capping layer CA may include Co doped with an impurity. The capping layer CA may be spaced apart from the liner LI in the third direction D3. The top portion AM_U of the anti-migration layer AM may be interposed between the capping layer CA and the liner LI. A thickness T1 of the capping layer CA may be greater than a thickness T2 of the liner LI. The thickness T1 of the capping layer CA may be equal to a minimum distance between a top surface and the bottom surface CA_B of the capping layer CA, and the thickness T2 of the liner LI may be equal to a minimum distance between an inner sidewall LI_IS and the outer sidewall LI_OS of the liner LI.

The capping layer CA may include a first sidewall CA_S1 and a second sidewall CA_S2 opposing each other. The first sidewall CA_S1 of the capping layer CA may be connected to the first outer sidewall BA_OS1 of the barrier layer BA. A lowermost portion of the first sidewall CA_S1 of the capping layer CA may contact an uppermost portion of the first outer sidewall BA_OS1 of the barrier layer BA. A lowermost portion of the second sidewall CA_S2 of the capping layer CA may contact an uppermost portion of the second outer sidewall BA_OS2 of the barrier layer BA. The width in the first direction D1 of the capping layer CA may be equal to a distance in the first direction D1 between the uppermost portion of the first outer sidewall BA_OS1 and the uppermost portion of the second outer sidewall BA_OS2 of the barrier layer BA.

The semiconductor device according to the example embodiments of the disclosure may include a separate anti-migration layer AM, and thus electro-migration characteristics of a material included in a conductive layer CO may be improved, thereby improving reliability of the semiconductor device.

In the semiconductor device according to the example embodiments of the disclosure, a liner LI may be disposed in the anti-migration layer AM (e.g., enclosed by the anti-migration layer AM). Thus, diffusion of the liner LI may be mitigated or prevented, and a phenomenon in which the liner LI is cut due to diffusion may be mitigated or prevented.

FIGS. 2A, 2B, 2C, 2D, 2E, 2F, and 2G are sectional views showing a method for manufacturing the semiconductor device according to FIG. 1.

Figure 2A:
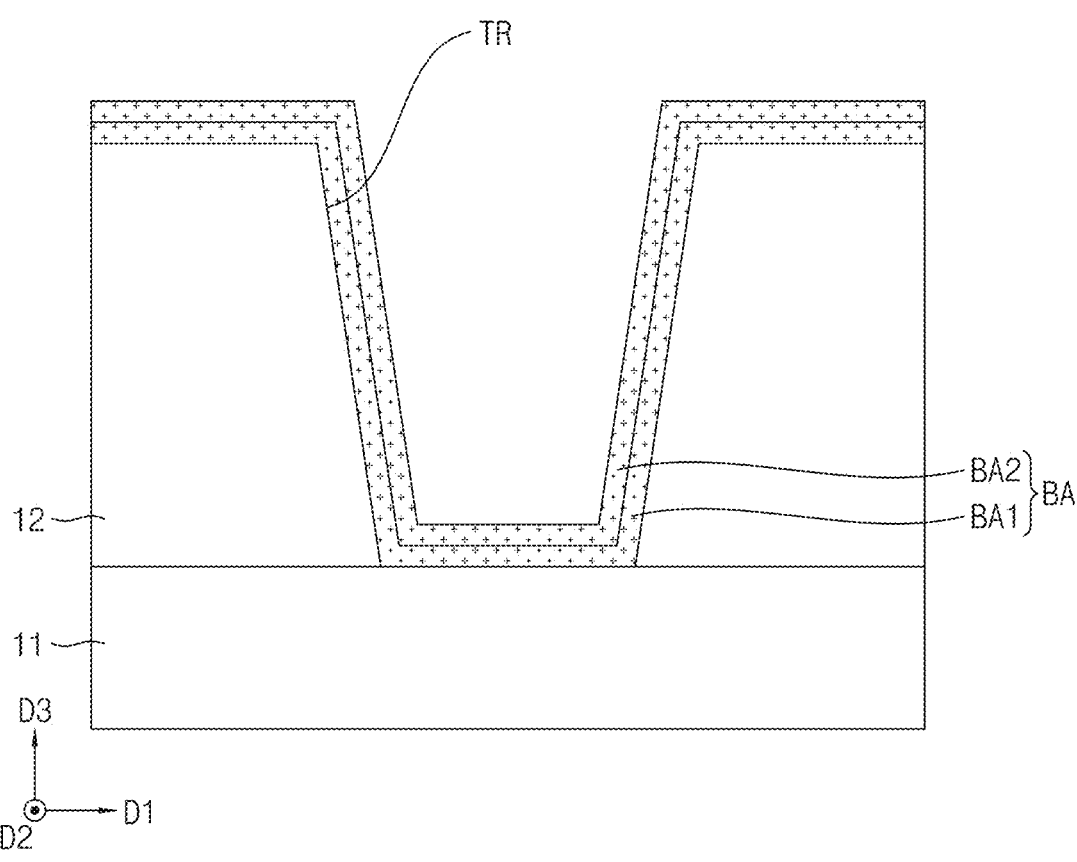
FIGS. 2A, 2B, 2C, 2D, 2E, 2F, and 2G are sectional views showing a method for manufacturing the semiconductor device according to FIG. 1.

Referring to FIG. 2A, a first insulating layer 11 and a second insulating layer 12 on the first insulating layer 11 may be formed. Subsequently, a trench TR may be formed at the second insulating layer 12. The trench TR may extend through the second insulating layer 12 to expose the first insulating layer 11. The trench TR may be formed by a dry etching process or a wet etching process.

A barrier layer BA may be formed. The barrier layer BA may be conformally formed on the first and second insulating layers 11 and 12. Formation of the barrier layer BA may include conformally forming a first barrier portion BA1 on the first and second insulating layers 11 and 12, and conformally forming a second barrier portion BA2 on the first barrier layer BA1. The first barrier portion BA1 may include, for example, TaN, and the second barrier portion BA2 may include, for example, Ta. In some example embodiments, a process for removing copper oxide exposed through the trench TR may be performed before formation of the barrier layer BA.

Figure 2B:
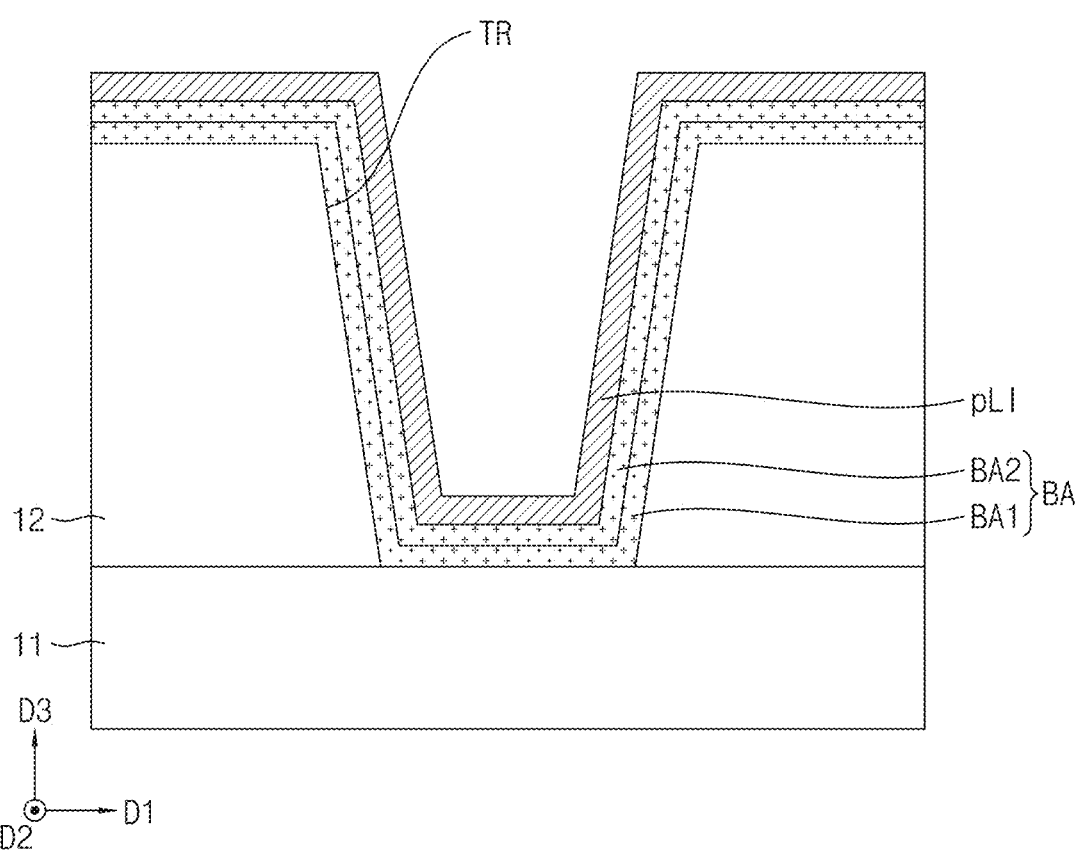

Referring to FIG. 2B, a preliminary liner pLI may be formed. The preliminary liner pLI may be conformally formed on the barrier layer BA. The preliminary liner pLI may include a conductive material different from that of the barrier layer BA. In some example embodiments, the preliminary liner pLI may include pure Co. In some example embodiments, the preliminary liner pLI may include Co doped with an impurity.

The preliminary liner pLI may be formed through, for example, a chemical vapor deposition (CVD) process, a physical vapor deposition (PVD) process, or an atomic layer deposition (ALD) process. For example, the preliminary liner pLI may be formed at a temperature of 150 to 250° C., and may be formed at a pressure of 10 to 30 Torr.

Figure 2C:
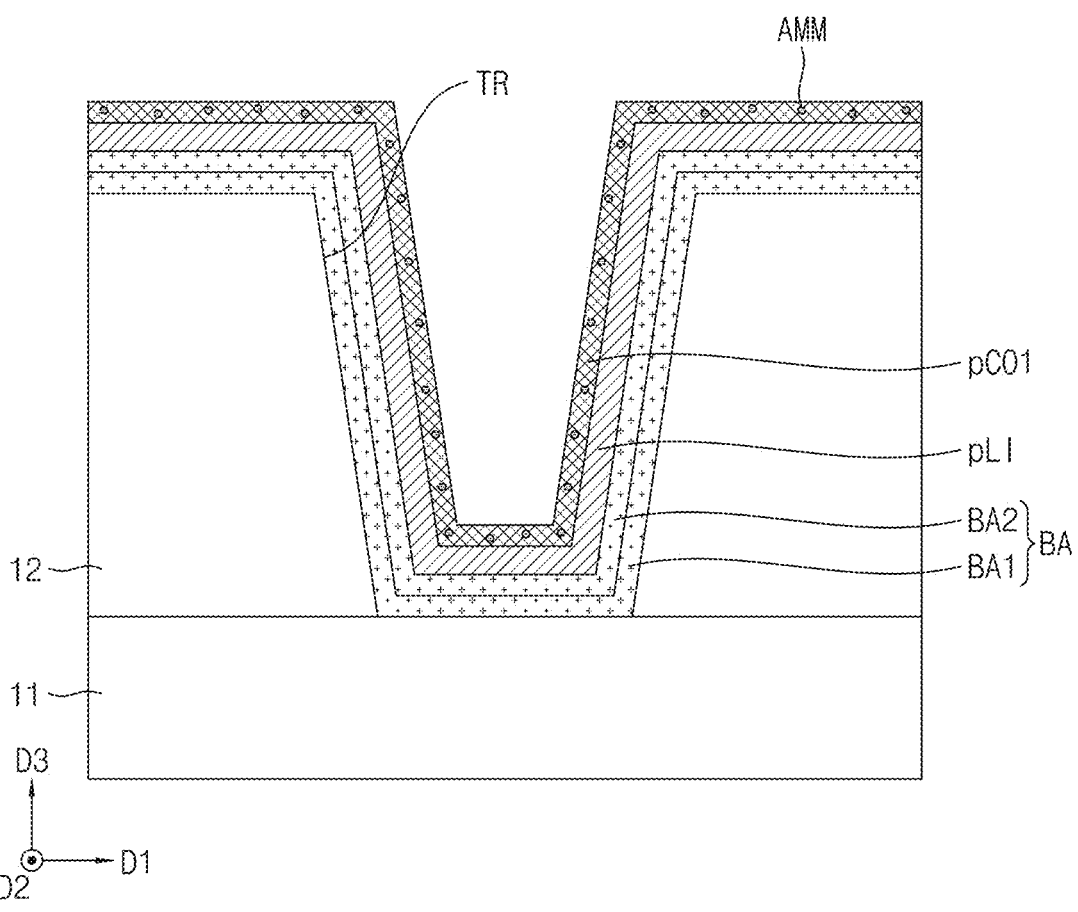

Referring to FIG. 2C, a first preliminary conductive layer pCO1 may be formed. The first preliminary conductive layer pCO1 may be conformally formed on the preliminary liner pLI. The first preliminary conductive layer pCO1 may include a conductive material different from those of the barrier layer BA and the preliminary liner pLI. The first preliminary conductive layer pCO1 may include an alloy including an anti-migration material AMM. For example, the first preliminary conductive layer pCO1 may include a CuMn alloy, which includes Mn as the anti-migration material AMM.

Figure 2D:
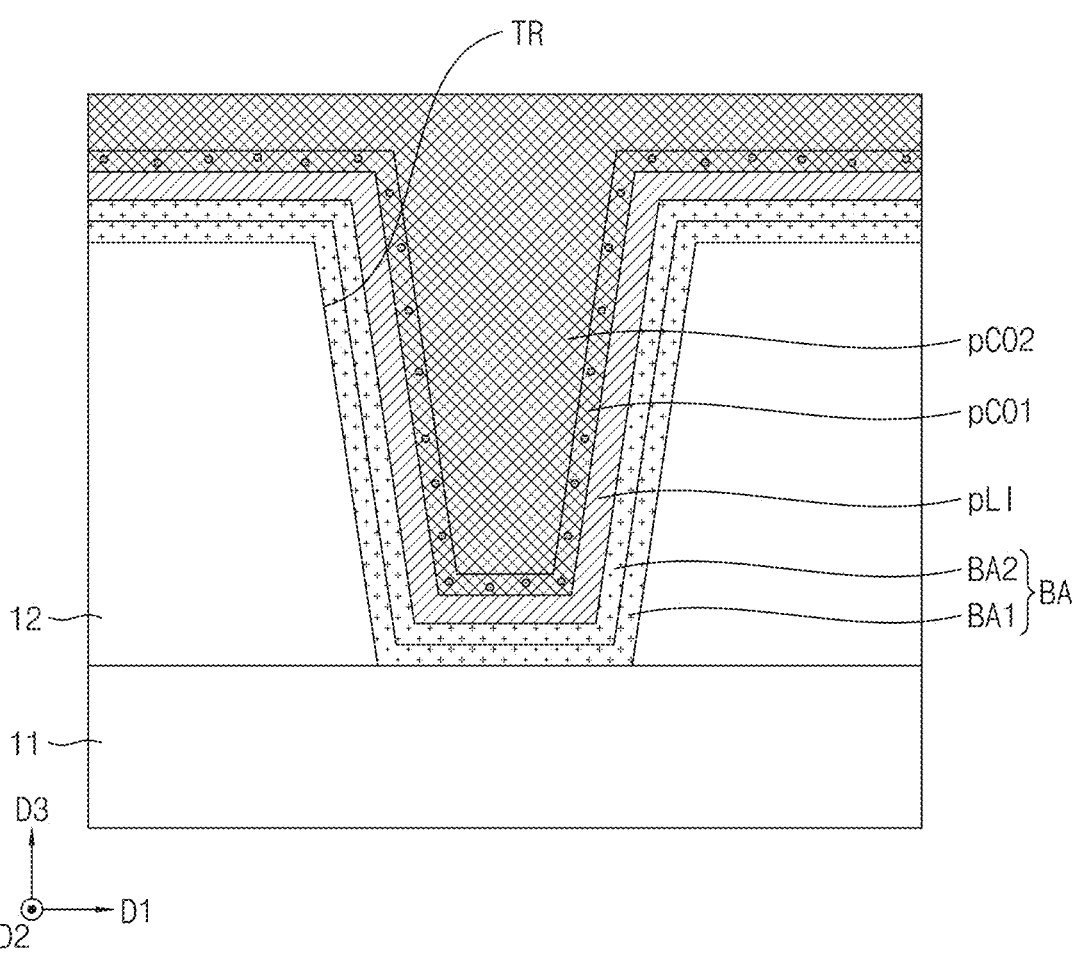

Referring to FIG. 2D, a second preliminary conductive layer pCO2 may be formed on the first preliminary conductive layer pCO1. As the second preliminary conductive layer pCO2 is formed, the trench TR may be filled with the barrier layer BA, the preliminary liner pLI, and the first and second preliminary conductive layers pCO1 and pCO2. The second preliminary conductive layer pCO2 may include a conductive material different from those of the barrier layer BA, the preliminary liner pLI, and the first preliminary conductive layer pCO1. For example, the second preliminary conductive layer pCO2 may include Cu.

Figure 2E:
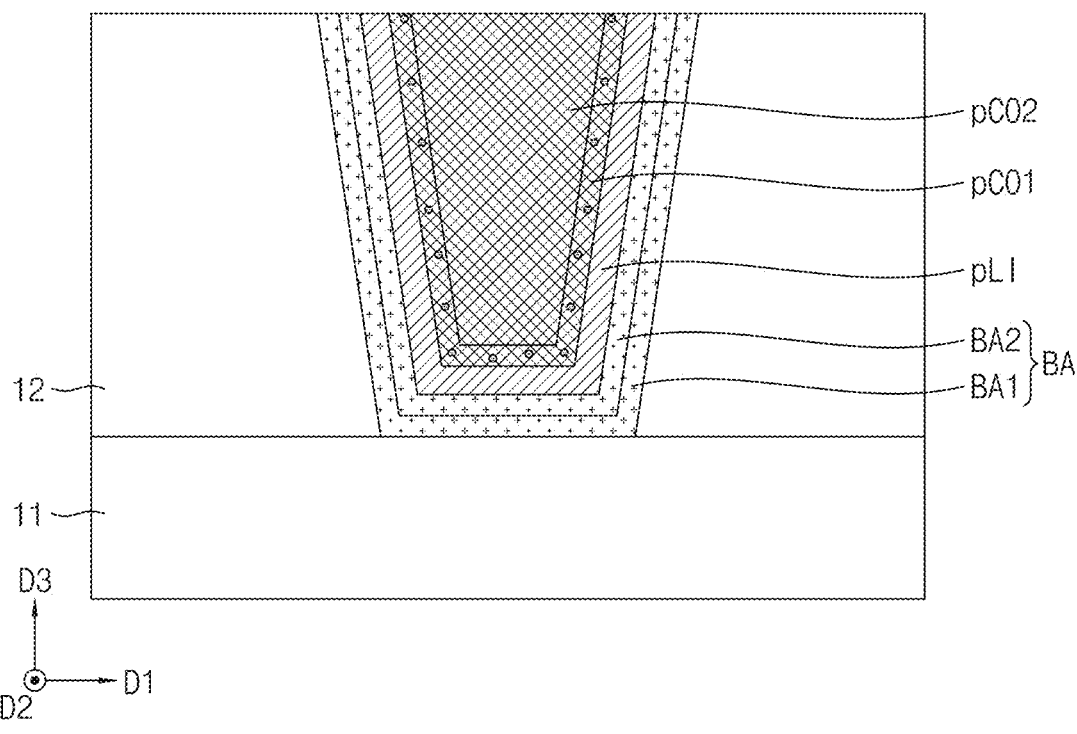

Referring to FIG. 2E, upper portions of the barrier layer BA, the preliminary liner pLI, and the first and second preliminary conductive layers pCO1 and pCO2 may be removed. The upper portions of the barrier layer BA, the preliminary liner pLI, and the first and second preliminary conductive layers pCO1 and pCO2 may be portions disposed at a higher level than a top surface of the second insulating layer 12. The upper portions of the barrier layer BA, the preliminary liner pLI, and the first and second preliminary conductive layers pCO1 and pCO2 may be removed by an etching process and/or a polishing process. In some example embodiments, an upper portion of the second insulating layer 12 may be removed together with the upper portions of the barrier layer BA, the preliminary liner pLI, and the first and second preliminary conductive layers pCO1 and pCO2.

Figure 2F:
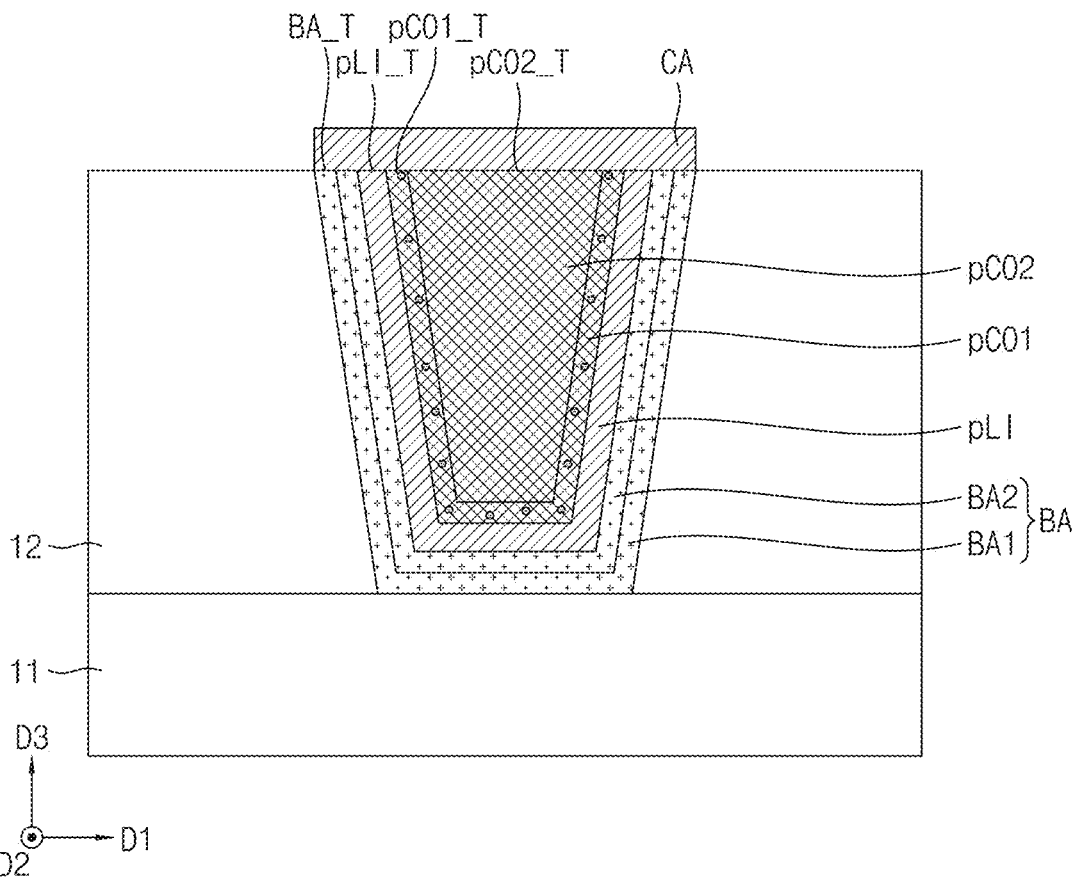

Referring to FIG. 2F, a capping layer CA may be formed. The capping layer CA may be selectively formed on a top surface BA_T of the barrier layer BA, a top surface pLI_T of the preliminary liner pLI, a top surface pCO1_T of the first preliminary conductive layer pCO1, and a top surface pCO2_T of the second preliminary conductive layer pCO2. The capping layer CA may not be formed on the top surface of the second insulating layer 12. The capping layer CA may include the same conductive material as the preliminary liner pLI. The capping layer CA may be formed through a selective deposition process. The capping layer CA may be formed through, for example, a CVD process, an ALD process, or an electroless deposition (ELD) process. For example, the capping layer CA may be formed at a temperature from normal temperature to 300° C., and may be formed at a pressure from normal pressure to 30 Torr.

Figure 2G:
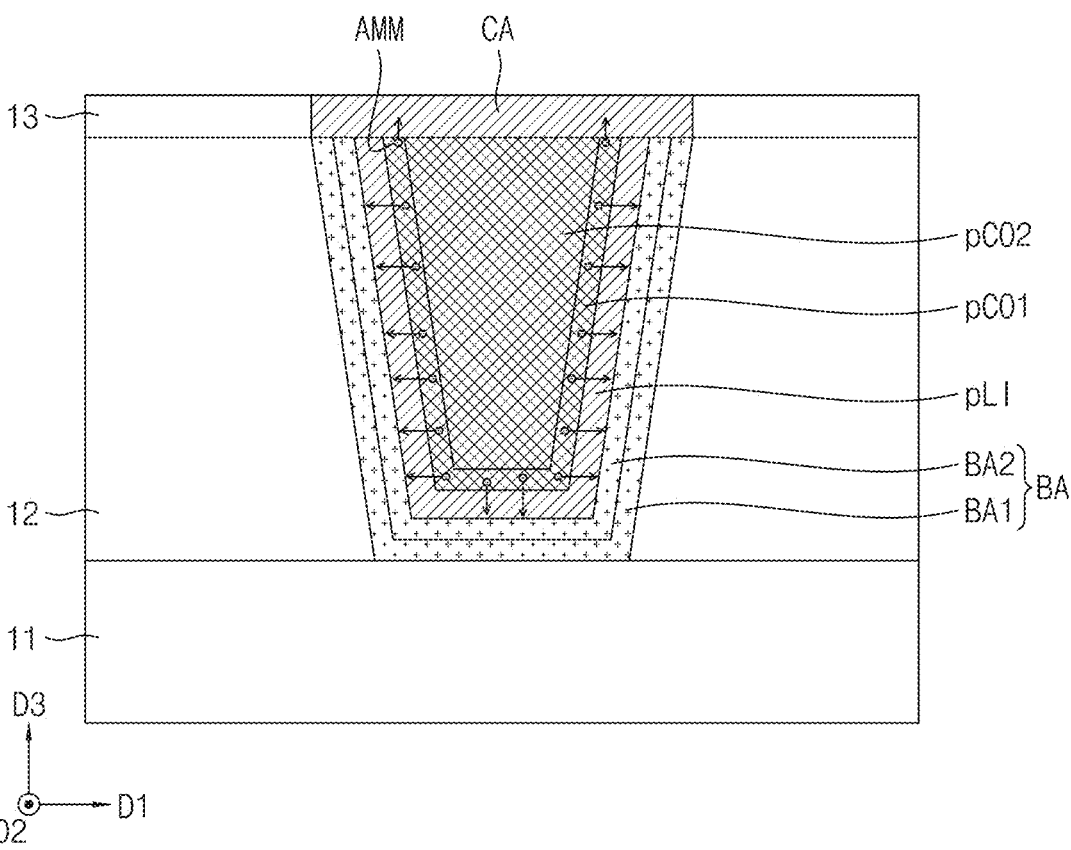

Referring to FIG. 2G, a third insulating layer 13 may be formed on the second insulating layer 12. The third insulating layer 13 may be formed to cover sidewalls of the capping layer CA. In some example embodiments, the third insulating layer 13 may be formed to cover sidewalls and a top surface of the capping layer CA.

A thermal treatment process may be performed. In accordance with the thermal treatment, the anti-migration material AMM in the first preliminary conductive layer pCO1 may be diffused toward the barrier layer BA and the capping layer CA. The anti-migration material AMM in the first preliminary conductive layer pCO1 may pass through the preliminary liner pLI by diffusion. In accordance with the thermal treatment process, the material in the preliminary liner pLI may be diffused toward the first and second preliminary conductive layers pCO1 and pCO2.

In accordance with diffusion of the anti-migration material AMM, an anti-migration layer AM (cf. FIG. 1) may be formed. The anti-migration layer AM may be constituted by the anti-migration material AMM. For example, the anti-migration layer AM may be formed as Mn in the first preliminary conductive layer pCO1 is diffused. In accordance with diffusion of the conductive material of the preliminary liner pLI, a liner LI (cf. FIG. 1) may be formed. The liner LI may be constituted by the conductive material of the preliminary liner pLI. For example, the liner LI may be formed as Co of the preliminary liner pLI is diffused.

Figure 3:
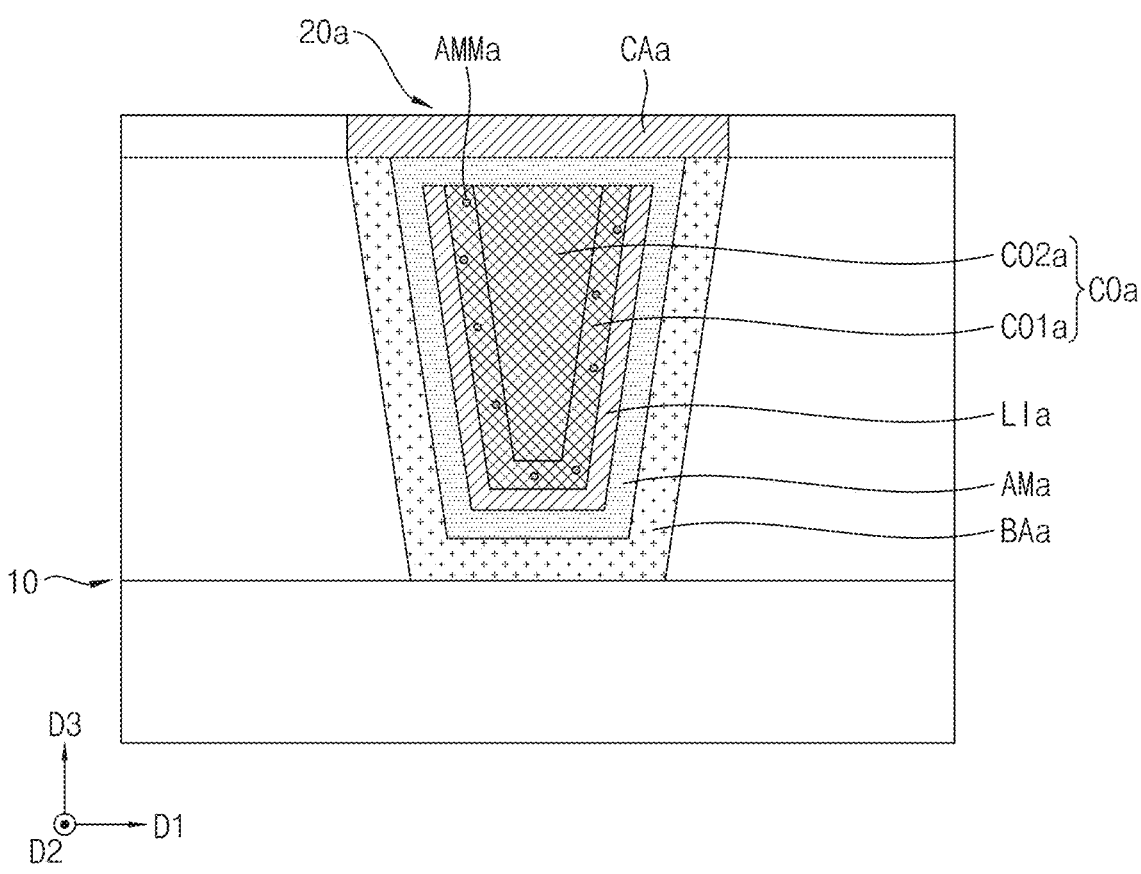
FIG. 3 is a sectional view of a semiconductor device according to some example embodiments of the disclosure.

FIG. 3 is a sectional view of a semiconductor device according to some example embodiments of the disclosure.

Referring to FIG. 3, a conductive structure 20a of the semiconductor device may include a barrier layer BAa, an anti-migration layer AMa, a liner LIa, a conductive layer COa, and a capping layer CAa.

The barrier layer BAa of the conductive structure 20a may be a single layer. For example, the barrier layer BAa may be a single layer including TaN.

The conductive layer COa of the conductive structure 20a may include a first conductive portion CO1a, and a second conductive portion CO2a on the first conductive portion CO1a. The first conductive portion CO1a may cover an outer sidewall and a bottom surface of the second conductive portion CO2a. The first conductive portion CO1a may contact the outer sidewall and the bottom surface of the second conductive portion CO2a.

The first conductive portion CO1a may include an alloy including an anti-migration material AMMa. For example, the first conductive portion CO1a may include a CuMn alloy, which includes Mn as the anti-migration material AMMa. For example, the second conductive portion CO2a may include Cu.

Figure 4:
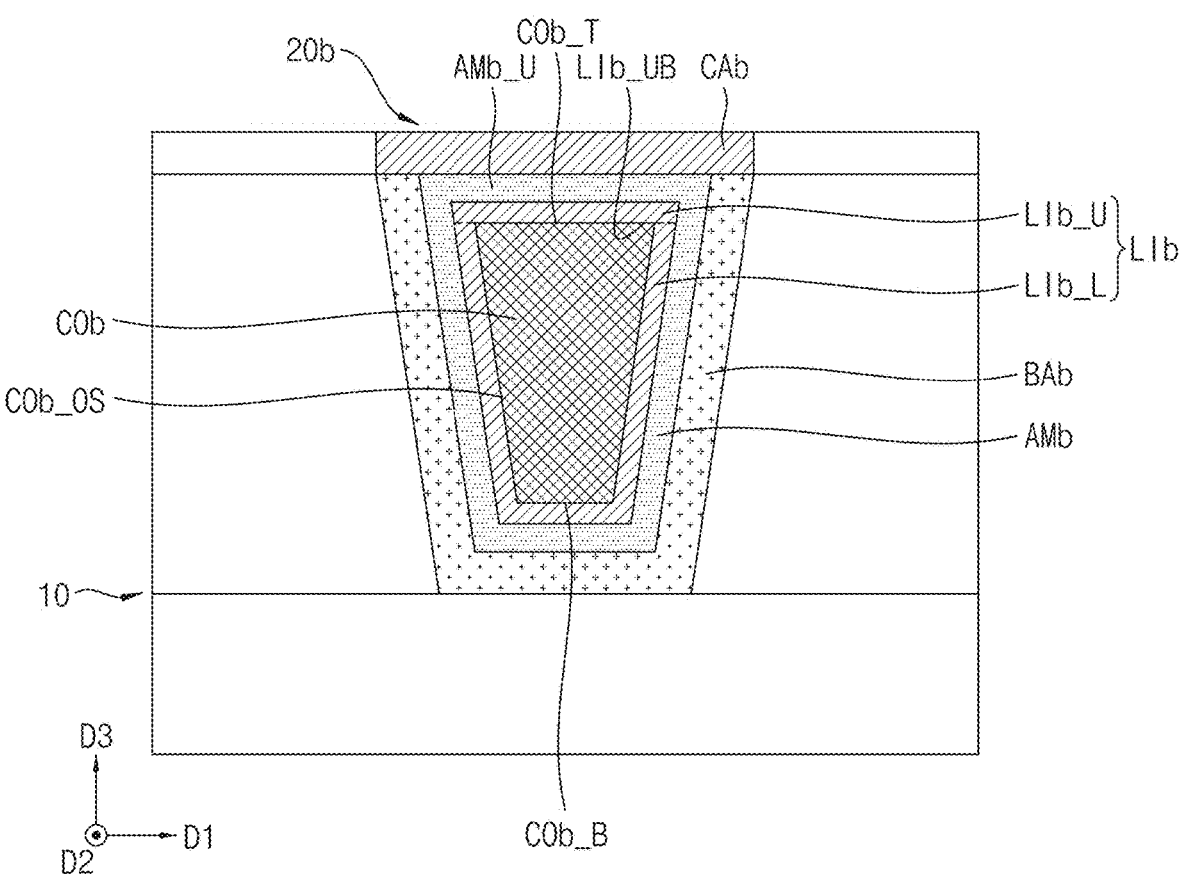
FIG. 4 is a sectional view of a semiconductor device according to some example embodiments of the disclosure.

FIG. 4 is a sectional view of a semiconductor device according to some example embodiments of the disclosure.

Referring to FIG. 4, a conductive structure 20b of the semiconductor device may include a barrier layer BAb, an anti-migration layer AMb, a liner LIb, a conductive layer COb, and a capping layer CAb.

The liner LIb of the conductive structure 20b may include an upper portion liner LIb_U and a lower portion LIb_L. The upper portion LIb_U of the liner LIb may be a portion covering a top surface COb_T of the conductive layer COb. The upper portion LIb_U of the liner LIb may be a portion disposed at a higher level than the top surface COb_T of the conductive layer COb. The lower portion LIb_L of the liner LIb may be a portion covering outer sidewalls COb_OS and a bottom surface COb_B of the conductive layer COb. The lower portion LIb_L of the liner LIb may be a portion disposed at a lower level than top surface COb_T of the conductive layer COb. Although the upper portion LIb_U and the lower portion LIb_L of the liner LIb have been described as being divided from each other, for convenience of description, the upper portion LIb_U and the lower portion LIb_L of the liner LIb may have an integrated structure in which the upper portion LIb_U and the lower portion LIb_L of the liner LIb are coupled to each other without having a boundary. A bottom surface LIb_UB of the upper portion LIb_U of the liner LIb may contact the top surface COb_T of the conductive layer COb. The upper portion LIb_U of the liner LIb may be interposed between the conductive layer COb and an upper portion AMb_U of the anti-migration layer AMb.

As a material included in the capping layer CAb is diffused through a thermal treatment process, the upper portion LIb_U of the liner LIb may be formed.

Figure 5:
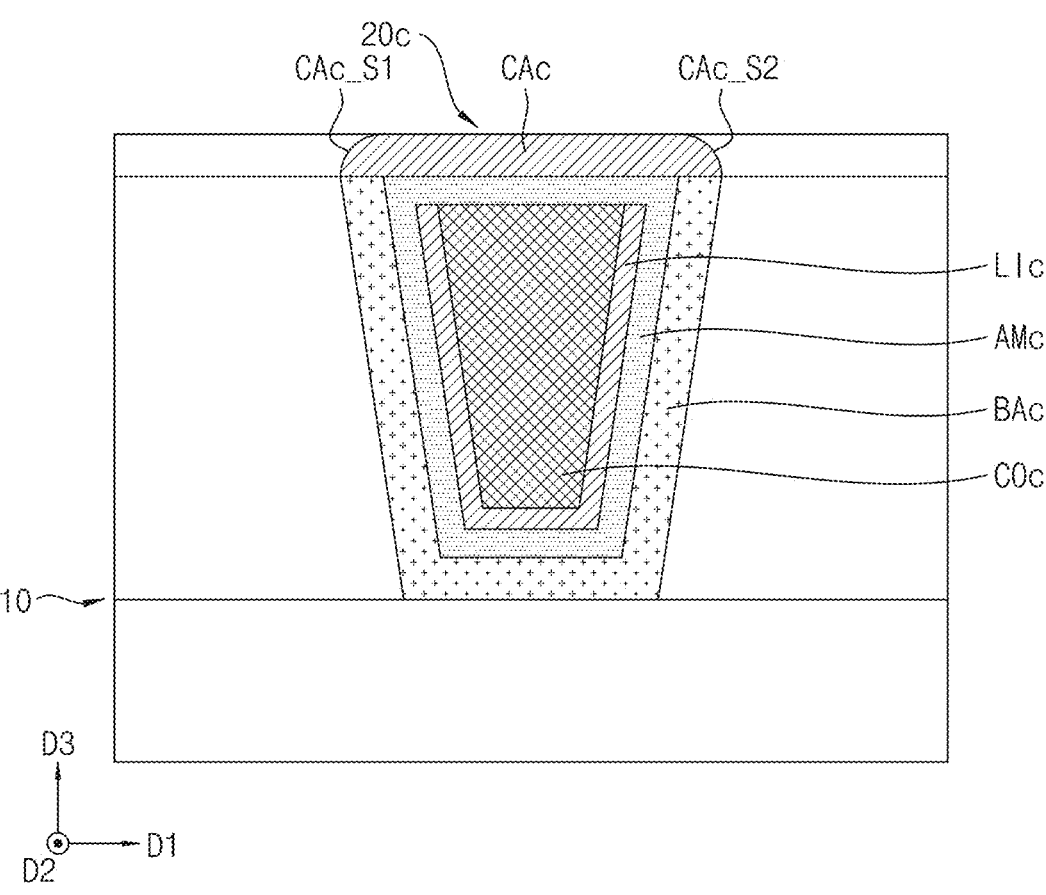
FIG. 5 is a sectional view of a semiconductor device according to some example embodiments of the disclosure.

FIG. 5 is a sectional view of a semiconductor device according to some example embodiments of the disclosure.

Referring to FIG. 5, a conductive structure 20c of the semiconductor device may include a barrier layer BAc, an anti-migration layer AMc, a liner LIc, a conductive layer COc, and a capping layer CAc.

The capping layer CAc of the conductive structure 20c may include a curved first sidewall CAc_S1 and a curved second sidewall CAc_S2. In a selective deposition process for the capping layer CAc, the first and second sidewalls CAc_S1 and CAc_S2 of the capping layer CAc may be formed to have a curved shape.

Figure 6:
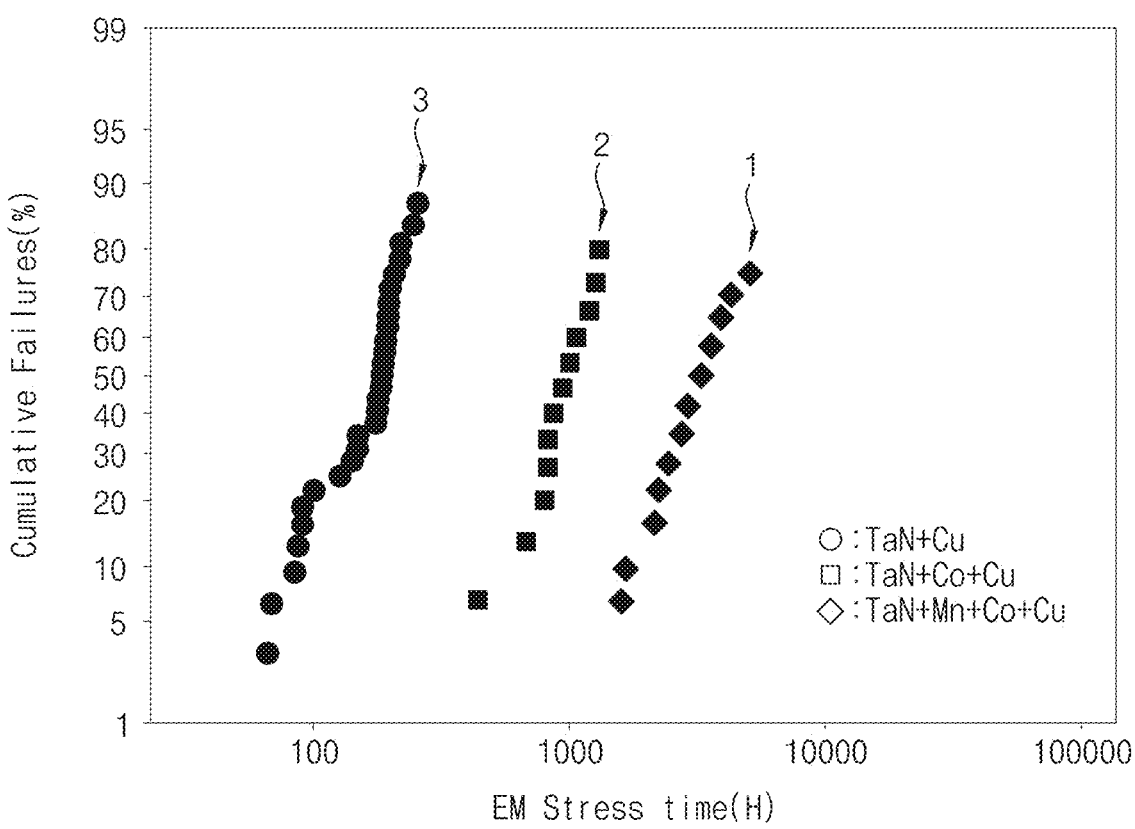
FIG. 6 is a graph explaining electro-migration characteristics of a conductive structure according to an example embodiment of the disclosure.

FIG. 6 is a graph explaining electro-migration characteristics of a conductive structure according to an example embodiment of the disclosure.

Referring to FIG. 6, electro-migration characteristics of a conductive structure 1 according to an example embodiment of the disclosure, a conductive structure 2 according to a first comparative example, and a conductive structure 3 according to a second comparative example were measured through experiments. The conductive structure 1 according to the example embodiment of the disclosure includes a TaN barrier layer, an Mn anti-migration layer, a Co liner, and a Cu conductive layer, the conductive structure 2 according to the first comparative example includes a TaN barrier layer, a Co liner, and a Cu conductive layer, and the conductive structure 3 according to the second comparative example includes a TaN barrier layer and a Cu conductive layer.

Through experiments under conditions of 300° C. and 0.8 mA, it has been observed that electro-migration characteristics of the Cu conductive layer of the conductive structure 1 according to the example embodiment of the disclosure are better than electro-migration characteristics of the Cu conductive layers of the conductive structure 2 according to the first comparative example and the conductive structure 3 according to the second comparative example.

The conductive structure 1 according to the example embodiment of the disclosure exhibits relatively improved electro-migration characteristics of the Cu conductive layer because the conductive structure 1 includes the Mn anti-migration layer.

Figure 7:
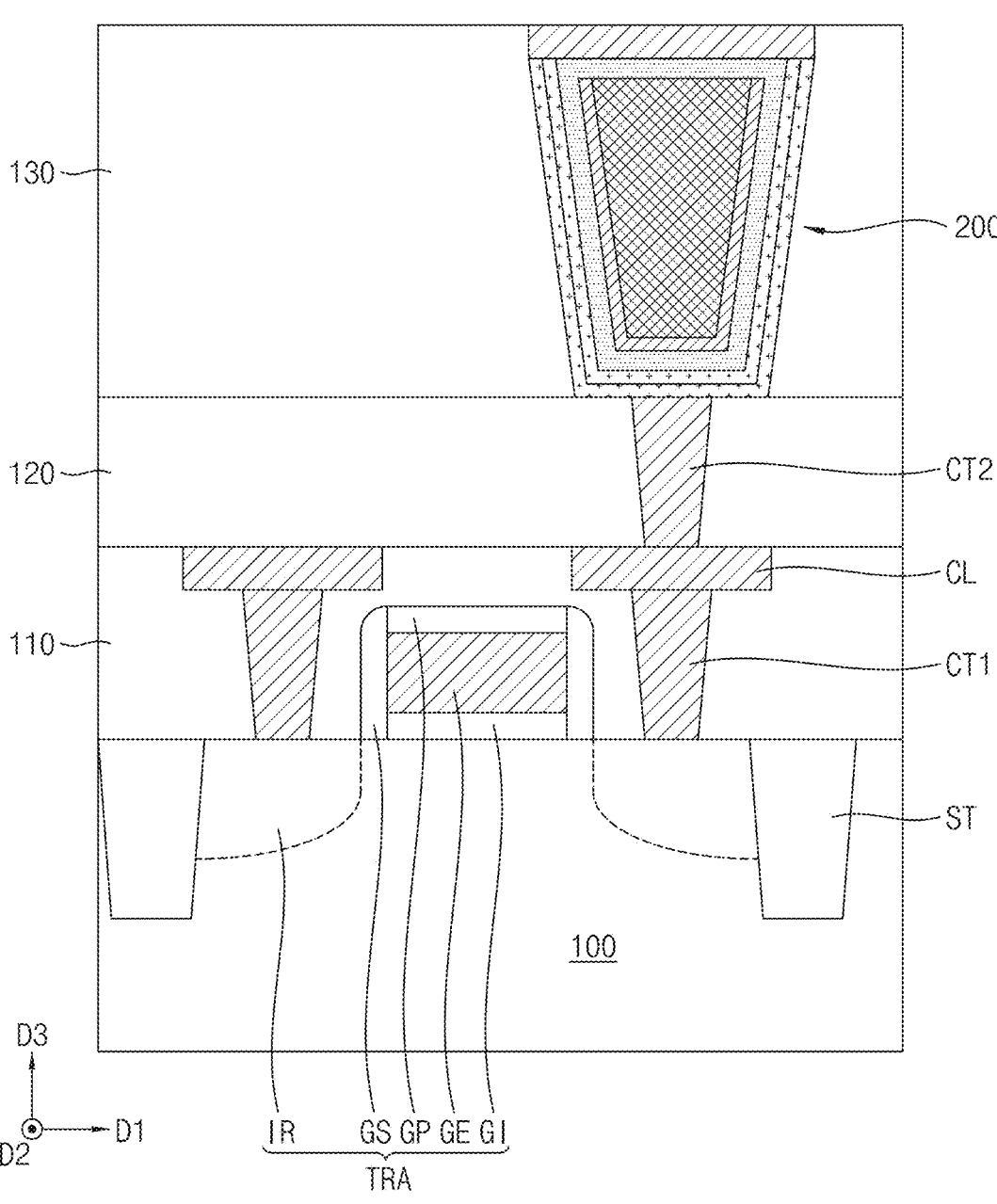
FIG. 7 is a sectional view of a semiconductor device according to some example embodiments of the disclosure.

FIG. 7 is a sectional view of a semiconductor device according to some example embodiments of the disclosure.

Referring to FIG. 7, the semiconductor device may include a substrate 100. In some example embodiments, the substrate 100 may be a semiconductor substrate. For example, the substrate 100 may include silicon, germanium, silicon-germanium, GaP, or GaAs. In some example embodiments, the substrate 100 may be a silicon-on-insulator (SOI) substrate or a germanium-on-insulator (GOI) substrate.

A first insulating layer 110 covering the substrate 100 may be provided. The first insulating layer 110 may include an insulating material. In some example embodiments, the first insulating layer 110 may be a multilayer insulating layer.

A transistor TRA may be provided on the substrate 100. For example, the transistor TRA may be a cell transistor or a peripheral transistor constituting a memory device, a logic device or an image sensor device. The transistor TRA may be covered by the first insulating layer 110. The transistor TRA may be connected to the substrate 100.

The transistor TRA may include impurity regions IR, and a channel and a gate structure which are disposed between the impurity regions IR. The gate structure may include gate spacers GS, and a gate insulating layer GI, a gate electrode GE and a gate capping layer GP that are disposed between the gate spacers GS. The impurity regions IR may be formed through implantation of an impurity in the substrate 100. The gate spacers GS, the gate insulating layer GI, and the gate capping layer GP may include an insulating material. The gate electrode GE may include a conductive material. The structure of the transistor TRA is not limited to the shown and described structure. In some example embodiments, the transistor may include a buried gate electrode. In some example embodiments, the transistor may include a vertical gate electrode. In some example embodiments, the transistor may include a gate all around structure.

Element isolation layers ST may be provided in the substrate 100. The transistor TRA may be provided between the element isolation layers ST. The element isolation layers ST may include an insulating material.

First contacts CT1 and conductive lines CL may be provided in the first insulating layer 110. The first contact CT1 may be connected to the transistor TRA, and the conductive line CL may be connected to the first contact CT1. The first contacts CT1 and the conductive lines CL may include a conductive material.

A second insulating layer 120 covering the first insulating layer 110 may be provided. The second insulating layer 120 may include an insulating material. In some example embodiments, the second insulating layer 120 may be a multilayer insulating layer.

A second contact CT2 may be provided in the second insulating layer 120. The second contact CT2 may be connected to the conductive line CL. The second contact CT2 may include a conductive material.

A third insulating layer 130 covering the second insulating layer 120 may be provided. The third insulating layer 130 may include an insulating material. In some example embodiments, the third insulating layer 130 may be a multilayer insulating layer.

A conductive structure 200 may be provided in the third insulating layer 130. The conductive structure 200 may include a barrier layer, an anti-migration layer, a liner, a conductive layer, and a capping layer. The conductive structure 200 may be electrically connected to the transistor TRA via the second contact CT2, the conductive line CL and the first contact CT1.

Figure 8A:
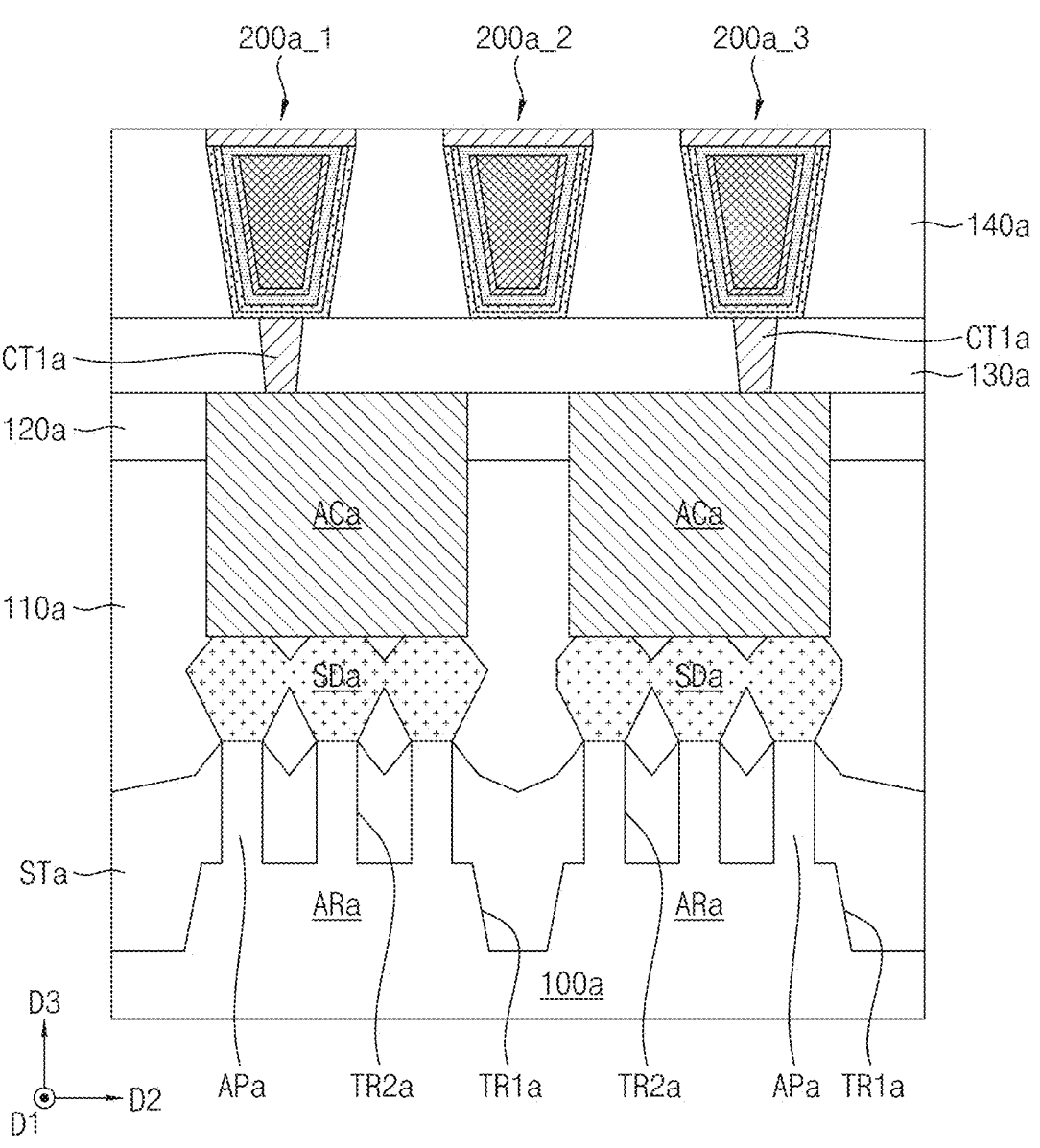
FIGS. 8A and 8B are sectional views of a semiconductor device according to some example embodiments of the disclosure.
Figure 8B:
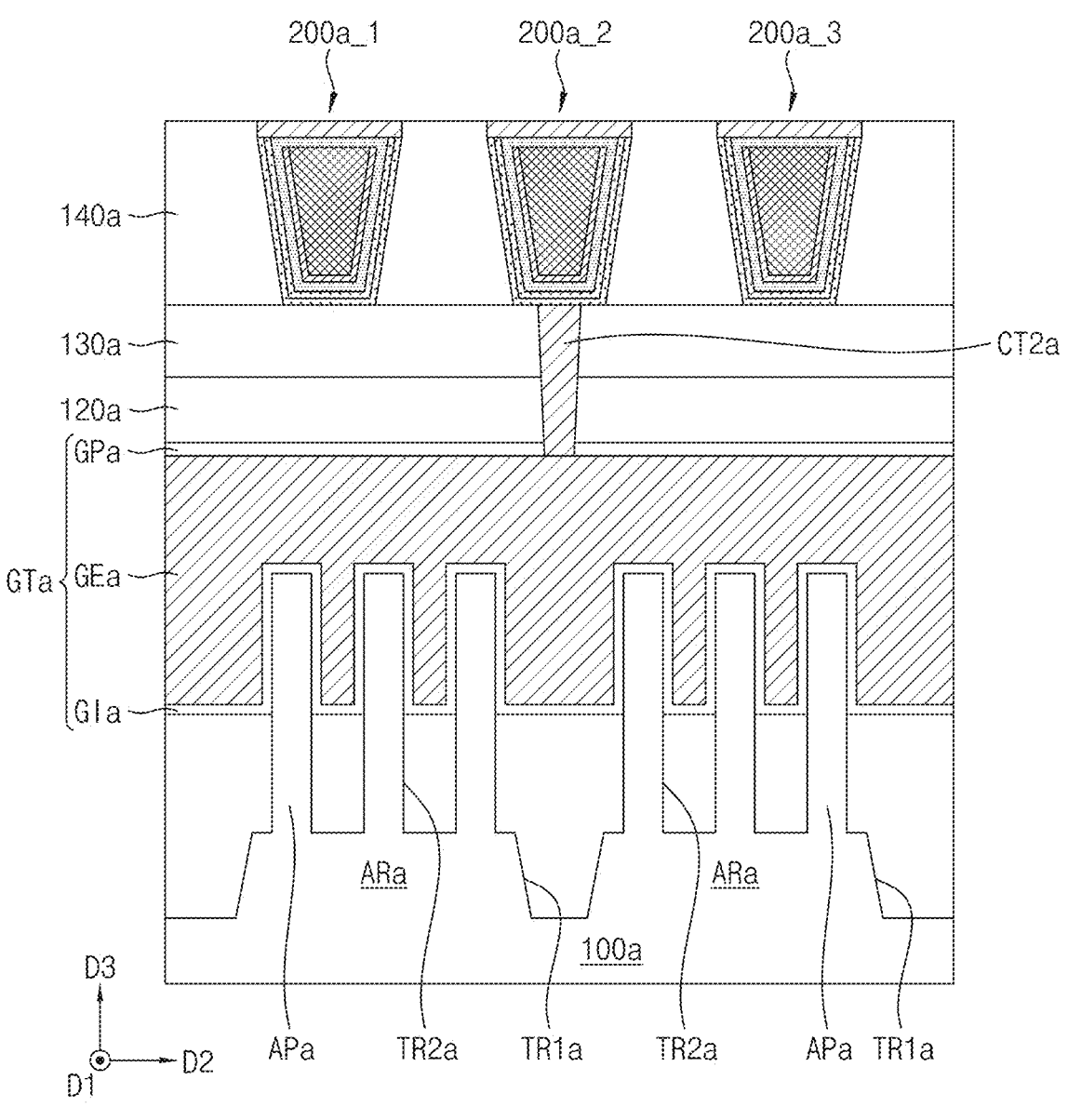

FIGS. 8A and 8B are sectional views of a semiconductor device according to some example embodiments of the disclosure.

Referring to FIGS. 8A and 8B, the semiconductor device may include a substrate 100a. The substrate 100a may include active regions ARa defined by first trenches TR1a.

The active regions ARa may be PMOSFET regions or NMOSFET regions. The substrate 100a may further include active patterns APa provided on the active regions ARa. The active patterns APa may protrude from the active region ARa in a third direction D3. The active patterns APa may be defined by second trenches TR2a.

An element isolation layer STa may be provided on the substrate 100a. The element isolation layer STa may fill the first and second trenches TR1a and TR2a. The active patterns APa may extend through the element isolation layer STa.

Source/drain patterns SDa may be provided on the active patterns APa. Each of the source/drain patterns SDa may be a P type impurity region or an N type impurity region. The source/drain patterns SDa may be epitaxial patterns formed through a selective epitaxial growth process. The source/drain patterns SDa may include a semiconductor material.

A gate structure GTa may be provided on the active patterns APa. The gate structure GTa may include a gate electrode GEa, a gate insulating layer GIa, and a gate capping layer GPa. The gate insulating layer GIa may cover the active patterns APa and the element isolation layer STa. The gate electrode GEa may be provided on the gate insulating layer GIa. The gate capping layer GPa may cover the gate electrode GEa.

A first insulating layer 110a covering the source/drain patterns SDa and the element isolation layer STa may be provided. A second insulating layer 120a covering the first insulating layer 110a and the gate structure GTa may be provided.

Active contacts ACa extending through the first and second insulating layers 110a and 120a may be provided. The active contacts ACa may be connected to the source/drain patterns SDa, respectively. The active contacts ACa may include a conductive material.

A third insulating layer 130a covering the second insulating layer 120a and the active contacts ACa may be provided. First contacts CT1a extending through the third insulating layer 130a may be provided. The first contacts CT1a may be connected to the active contacts ACa, respectively. A second contact CT2a extending through the second and third insulating layers 120a and 130a may be provided. The second contact CT2a may be connected to the gate electrode GEa.

A fourth insulating layer 140a covering the third insulating layer 130a may be provided. A first conductive structure 200a_1, a second conductive structure 200a_2, and a third conductive structure 200a_3 may be provided in the fourth insulating layer 140a. The first to third conductive structures 200a_1, 200a_2, and 200a_3 may extend in parallel. Each of the first and third conductive structures 200a_1 and 200a_3 may be electrically connected to the source/drain pattern SDa via the first contact CT1a and the active contact ACa. The second conductive structure 200a_2 may be electrically connected to the gate electrode GEa via the second contact CT2a. Each of the first to third conductive structures 200a_1, 200a_2, and 200a_3 may include a barrier layer, an anti-migration layer, a liner, a conductive layer, and a capping layer.

Figure 9A:
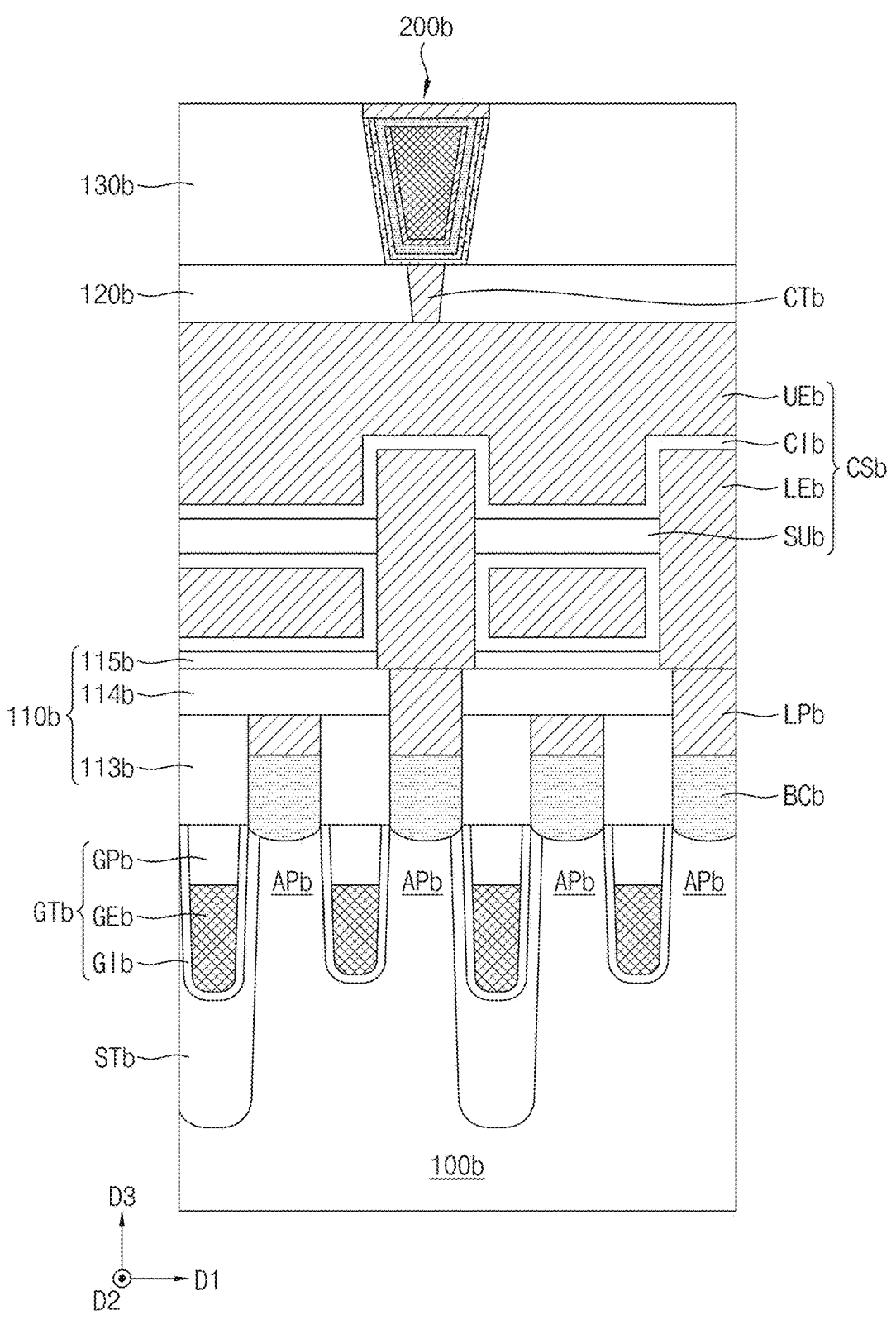
FIGS. 9A and 9B are sectional views of a semiconductor device according to some example embodiments of the disclosure.
Figure 9B:
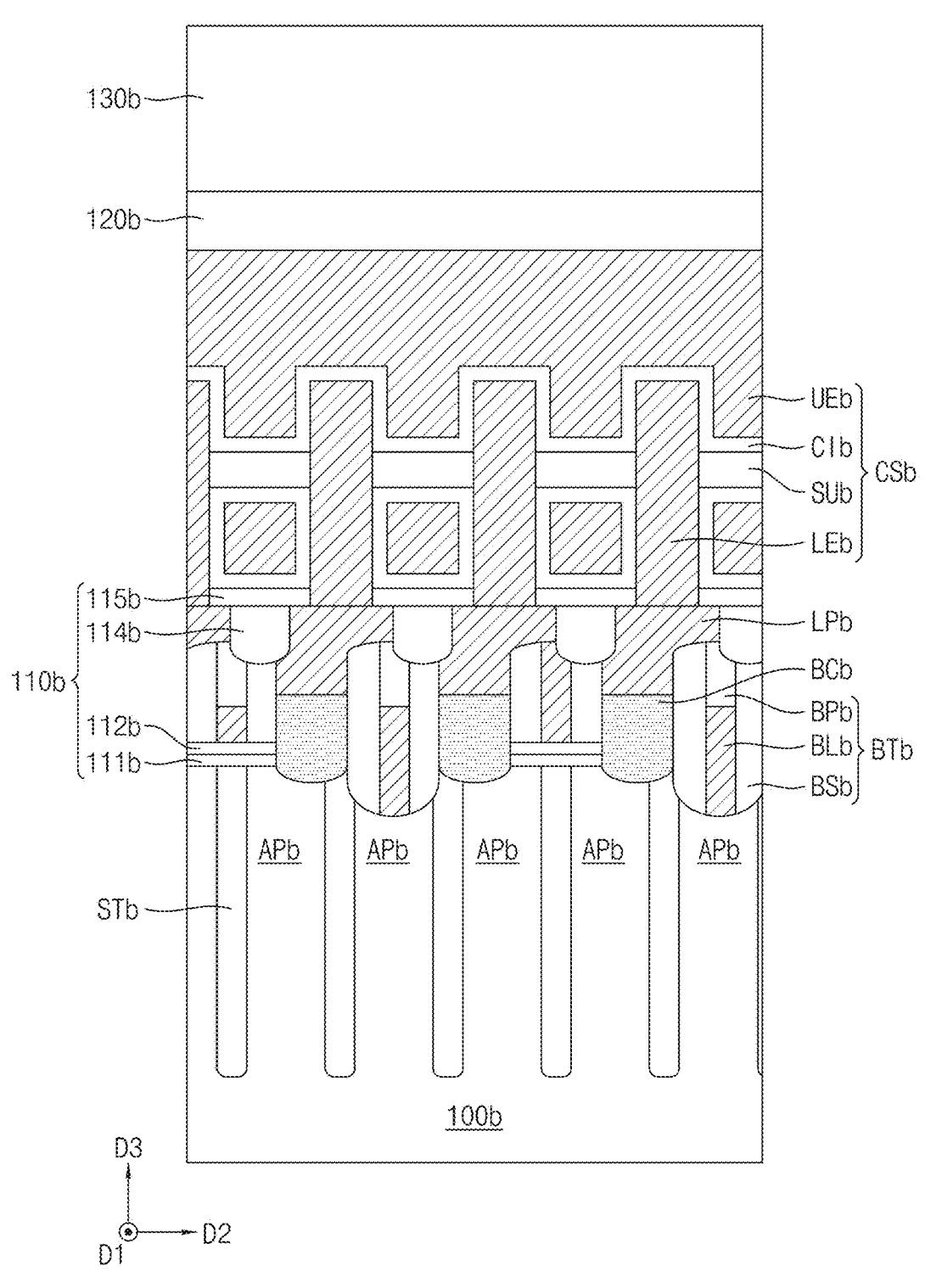

FIGS. 9A and 9B are sectional views of a semiconductor device according to some example embodiments of the disclosure.

Referring to FIGS. 9A and 9B, the semiconductor device may include a substrate 100b. The substrate 100b may include active patterns APb. Upper portions of the substrate 100b protruding in a third direction D3 may be defined as the active patterns APb.

An element isolation layer STb may be provided in a space provided among the active patterns APb. Each of the active patterns APb may be surrounded by the element isolation layer STb.

Gate structures GTb extending in a second direction D2 may be provided. The gate structures GTb may be spaced apart from one another in a first direction D1. The gate structure GTb may be a buried gate structure buried in the active patterns APb and the element isolation layer STb. The active patterns APb may include impurity regions. A cell transistor including the gate structure GTb and the impurity regions of the active pattern APb may be defined.

Each of the gate structures GTb may include a gate insulating layer GIb, a gate electrode GEb, and a gate capping layer GPb. The gate insulating layer GIb may cover surfaces of the active patterns APb and the element isolation layer STb. The gate electrode GEb and the gate capping layer GPb may be provided in the gate insulating layer GIb.

Bit line structures BTb extending in the first direction D1 may be provided. The bit line structures BTb may be spaced apart from one another in the second direction D2. The bit line structure BTb may be electrically connected to the active pattern APb.

Each of the bit line structures BTb may include a bit line BLb, a bit line capping layer BPb, and bit line spacers BSb. The bit line BLb may be connected to the active pattern APb. The bit line BLb may include a conductive material. The bit line capping layer BPb may be provided on the bit line BLb. The bit line capping layer BPb may include an insulating material. The bit line spacers BSb may be provided at opposite sides of the bit line BLb and the bit line capping layer BPb. The bit line spacers BSb may include an insulating material.

An interlayer insulating layer 110b covering the substrate 100b, the gate structures GTb and the bit line structures BTb may be provided. The interlayer insulating layer 110b may include first and second insulating pattens 111b and 112b, insulating fences 113b, a separation pattern 114b, and an etch stop layer 115b.

Buried contacts BCb connected to the active patterns APb of the substrate 100b may be provided, and landing pads LPb connected to the buried contacts BCb may be provided. The buried contacts BCb and the landing pads LPb may include a conductive material.

First and second insulating patterns 111b and 112b may be provided on the substrate 100b. The first and second insulating patterns 111b and 112b may include different insulating materials, respectively. The insulating fences 113b may be provided on the gate capping layer GPb of the gate structure GTb. The insulating fence 113b may be provided between adjacent ones of the bit line structures BTb. The insulating fence 113b may include an insulating material.

The separation pattern 114b may be provided on the bit line structures BTb and the insulating fences 113b. The separation pattern 114b may space the landing pads LPb apart from one another. The separation pattern 114b may include an insulating material. The etch stop layer 115b may be provided on the separation pattern 114b. The etch stop layer 115b may include an insulating material.

A capacitor structure CSb may be provided on the etch stop layer 115b. The capacitor structure CSb may include lower electrodes LEb, a capacitor insulating layer CIb, supporters SUb, and an upper electrode UEb. The capacitor structure CSb may be connected to the landing pad LPb. The capacitor structure CSb may be electrically connected to the active pattern APb via the landing pad LPb and the buried contact BCb.

A first insulating layer 120b covering the capacitor structure CSb may be provided. A contact CTb extending through the first insulating layer 120b may be provided. The contact CTb may be connected to the upper electrode UEb of capacitor structure CSb. A second insulating layer 130b covering the first insulating layer 120b may be provided.

A conductive structure 200b may be provided in the second insulating layer 130b. The conductive structure 200b may be electrically connected to the upper electrode UEb of the capacitor structure CSb via the contact CTb. The conductive structure 200b may include a barrier layer, an anti-migration layer, a liner, a conductive layer, and a capping layer.

The semiconductor device according to the example embodiments of the disclosure may include an anti-migration layer, and thus may have improved electro-migration characteristics.

While some example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device comprising:
an insulating structure; and
a conductive structure in the insulating structure,
wherein the conductive structure comprises,
a barrier layer,
an anti-migration layer on the barrier layer,
a liner on the anti-migration layer,
a conductive layer on the liner, and
a capping layer covering a top surface of the barrier layer and a top surface of the anti-migration layer,
wherein the capping layer and the liner comprise Co, and
wherein the anti-migration layer comprises Mn;
wherein an upper portion of the anti-migration layer is between the capping layer and the liner.

2. The semiconductor device according to claim 1, wherein a thickness of the liner is smaller than a thickness of the capping layer.

3. The semiconductor device according to claim 1, wherein the anti-migration layer comprises an upper portion covering a top surface of the liner and a top surface of the conductive layer, and a lower portion covering an outer sidewall and a bottom surface of the liner.

4. The semiconductor device according to claim 1, wherein:
the barrier layer comprises a first barrier portion and a second barrier portion on the first barrier portion;
the first barrier portion comprises TaN; and
the second barrier portion comprises Ta.

5. The semiconductor device according to claim 1, wherein the liner comprises an upper portion covering a top surface of the conductive layer, and a lower portion covering an outer sidewall and a bottom surface of the conductive layer.

6. The semiconductor device according to claim 1, wherein:
the conductive layer comprises a first conductive portion, and a second conductive portion in the first conductive portion;
the first conductive portion comprises a CuMn alloy; and
the second conductive portion comprises Cu.

7. A semiconductor device comprising:

an insulating structure;

and a conductive structure in the insulating structure, wherein the conductive structure comprises, a conductive layer, a liner covering an outer sidewall of the conductive layer, an anti-migration layer covering an outer sidewall of the liner, a barrier layer covering an outer sidewall of the anti-migration layer, and a capping layer covering a top surface of the anti-migration layer and a top surface of the barrier layer, wherein an upper portion of the anti-migration layer comprises a bottom surface contacting a top surface of the liner.

8. The semiconductor device according to claim 7, wherein:

the liner and the capping layer comprise Co doped with an impurity; and the impurity is at least one of N, P, W, or B.

9. The semiconductor device according to claim 7, wherein the bottom surface of the upper portion of the anti-migration layer contacts a top surface of the conductive layer.

10. The semiconductor device according to claim 7, wherein:

a maximum width in a horizontal direction of the capping layer is substantially equal to a distance in the horizontal direction between an uppermost portion of a first outer sidewall of the barrier layer and an uppermost portion of a second outer sidewall of the barrier layer; and the first outer sidewall and the second outer sidewall of the barrier layer oppose each other.

11. The semiconductor device according to claim 7, wherein an upper portion of the liner comprises a top surface contacting the bottom surface of the upper portion of the anti-migration layer, and a bottom surface contacting a top surface of the conductive layer.

12. The semiconductor device according to claim 7, wherein:

the capping layer and the liner comprise a same conductive material; and the capping layer and the liner are spaced apart from each other with the upper portion of the anti-migration layer therebetween.

13. The semiconductor device according to claim 7, wherein the barrier layer comprises TaN.

14. A semiconductor device comprising:

an insulating structure; and a conductive structure in the insulating structure, wherein the conductive structure comprises, a barrier layer, an anti-migration layer on the barrier layer, a liner on the anti-migration layer, a conductive layer on the liner, and a capping layer covering a top surface of the barrier layer and a top surface of the anti-migration layer, wherein a first sidewall of the capping layer is connected to a first outer sidewall of the barrier layer, wherein a second side wall of the capping layer is connected to a second outer sidewall of the barrier layer, wherein the liner is spaced apart from the capping layer, and wherein the liner and the capping layer comprise Co.

15. The semiconductor device according to claim 14, wherein the first and second sidewalls of the capping layer are curved.

16. The semiconductor device according to claim 14, wherein:

the first sidewall of the capping layer contacts an uppermost portion of the first outer sidewall of the barrier layer; and the second sidewall of the capping layer contacts an uppermost portion of the second outer sidewall of the barrier layer.

17. The semiconductor device according to claim 14, wherein an upper portion of the anti-migration layer is between the capping layer and the liner.

18. The semiconductor device according to claim 14, wherein, in a cross-sectional view, the anti-migration layer surrounds the conductive layer and the liner.

* * * * *